United States Patent [19]

McGuire et al.

[11] 4,404,639

[45] Sep. 13, 1983

[54] AUTOMOTIVE DIAGNOSTIC SYSTEM

[75] Inventors: John F. McGuire, Orinda; J. Steven Hurt, Alameda; Ronald L. Wilkerson, Novato, all of Calif.

[73] Assignee: Chevron Research Company, San Francisco, Calif.

[21] Appl. No.: 212,301

[22] Filed: Dec. 2, 1980

[51] Int. Cl.³ .................... G06F 11/32; G06F 15/20
[52] U.S. Cl. .................................. 364/551; 364/424; 364/431.11; 364/579
[58] Field of Search ............. 364/424, 431.01, 431.11, 364/431.12, 551, 579, 580

[56] References Cited

U.S. PATENT DOCUMENTS 4,128,005 12/1978 Arnston et al. ................ 364/431.01
4,270,174 5/1981 Karlin et al. ......................... 364/551
4,271,402 6/1981 Kastura et al. ................. 364/431.11

Primary Examiner—Jerry Smith
Attorney, Agent, or Firm—D. A. Newell; E. J. Keeling

[57] ABSTRACT

A method and apparatus are disclosed for facilitating the diagnosis and servicing of automotive vehicles wherein a communicating network computer interfaces between a plurality of service agencies and a vehicle data base plus a record storage system. The service agencies have diagnostic test equipment that are provided with unique vehicle specifications and diagnostic information from the vehicle data base through the network computer. Measured diagnostic data from the diagnostic test equipment is supplied to the record storage system through the network computer as well as to display and printing equipment at the service agency. The data stored and displayed and the unique vehicle specifications are sorted by the unique identification of the vehicle. The apparatus permits data base access for improvements and changes to the data base. The storage permits retrieval of data by vehicle, type of service, and summary records to provide improved service agency operation.

25 Claims, 4 Drawing Figures

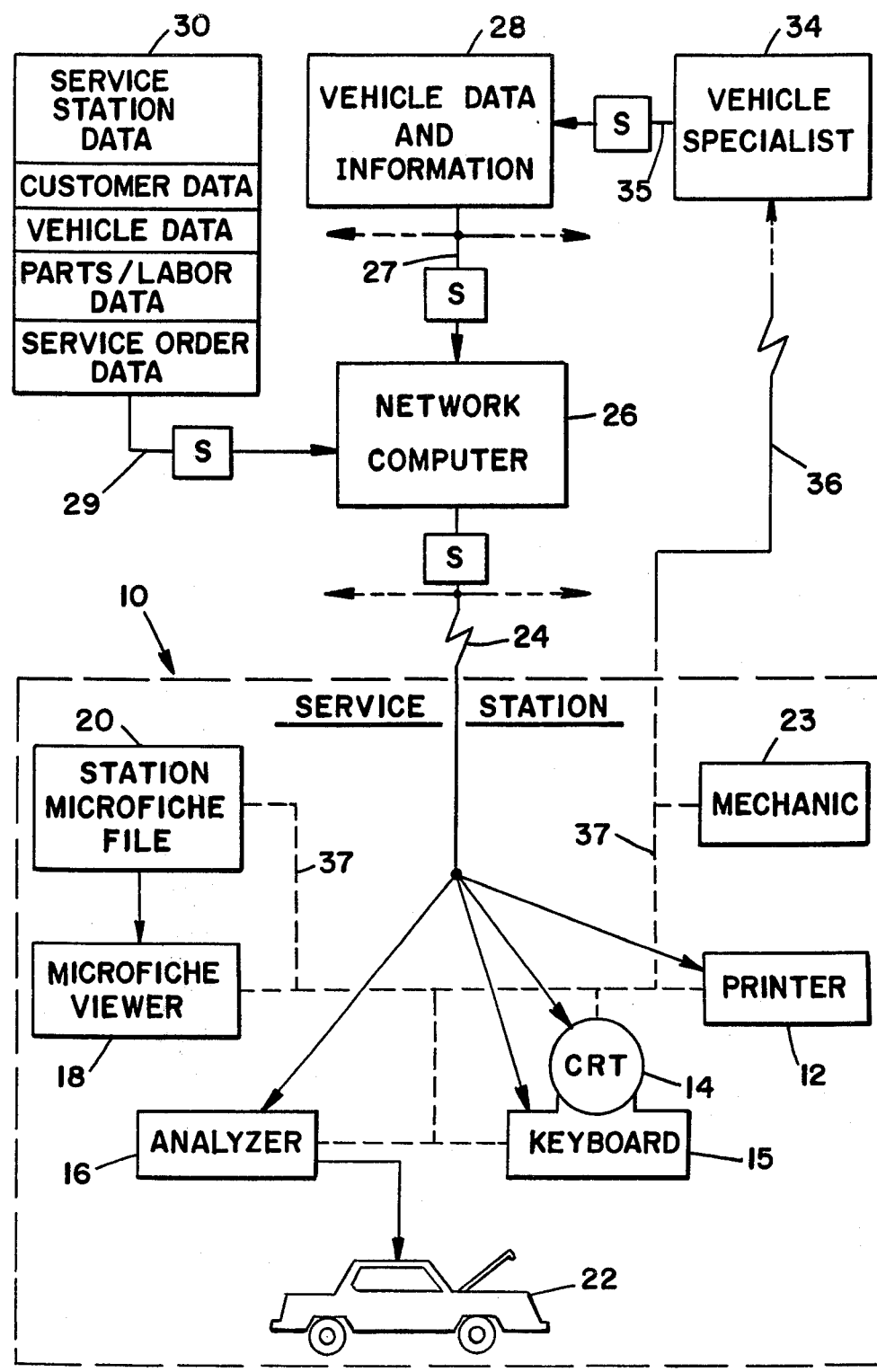
FIG _ 1

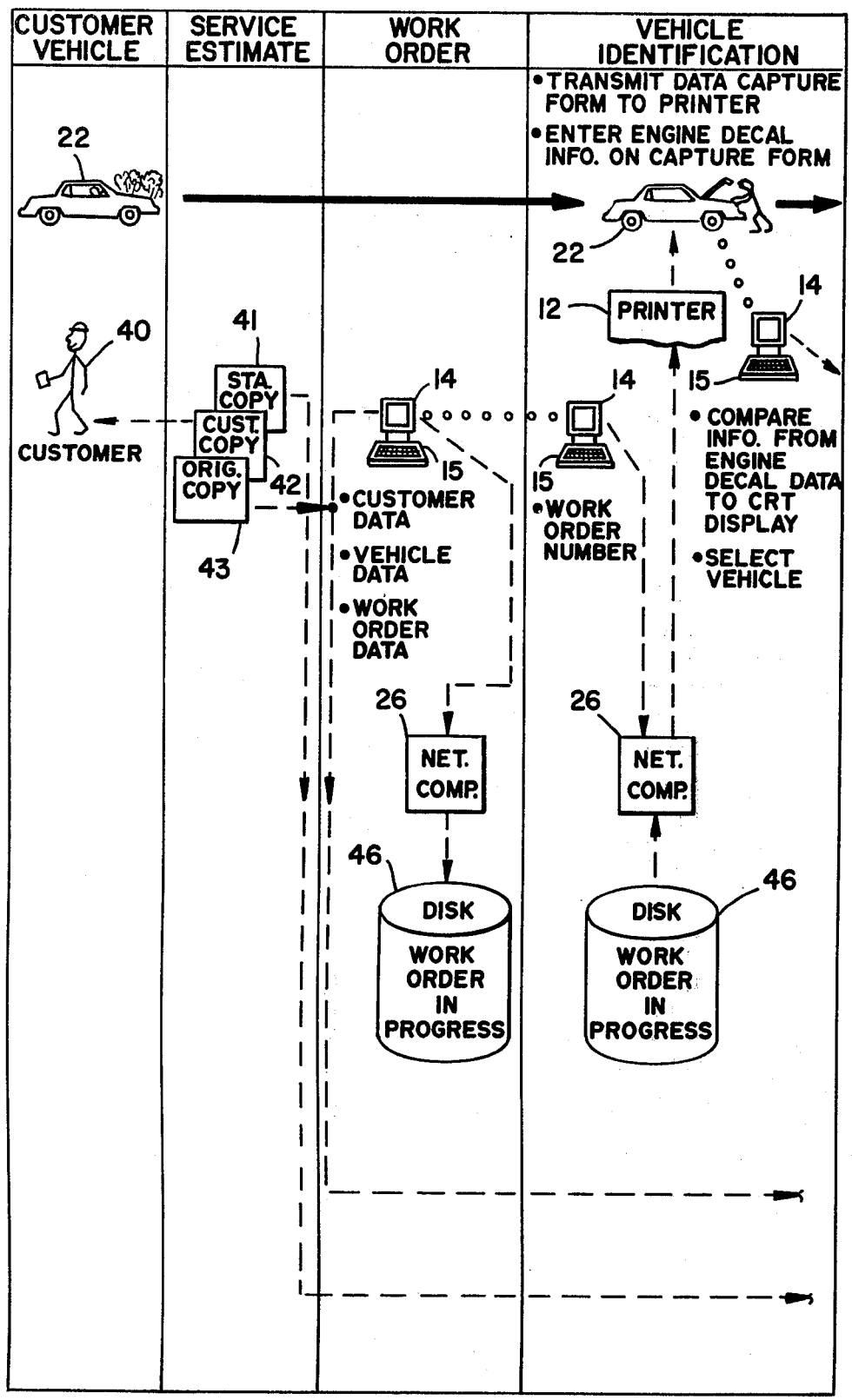
FIG_2A

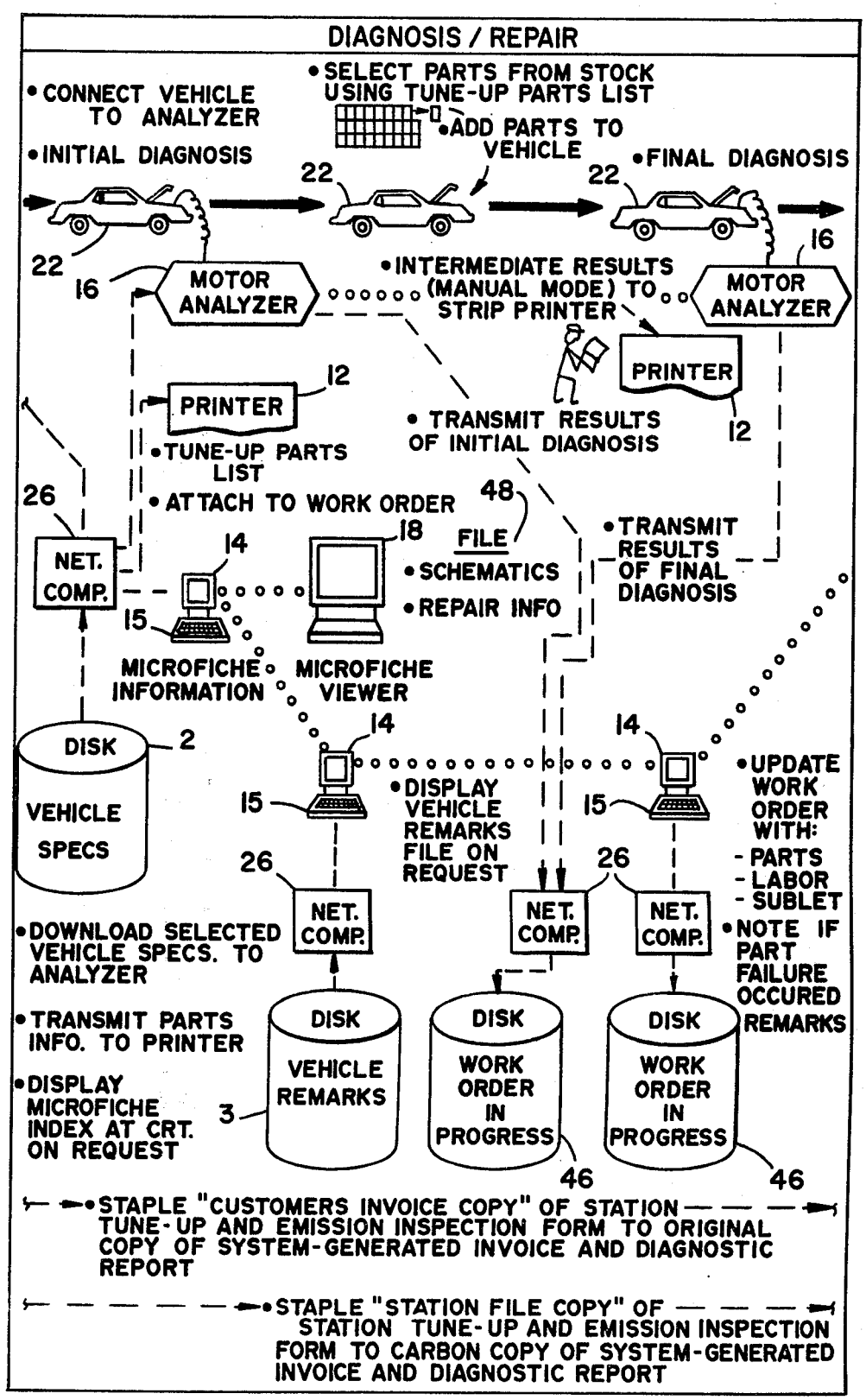
FIG_2B

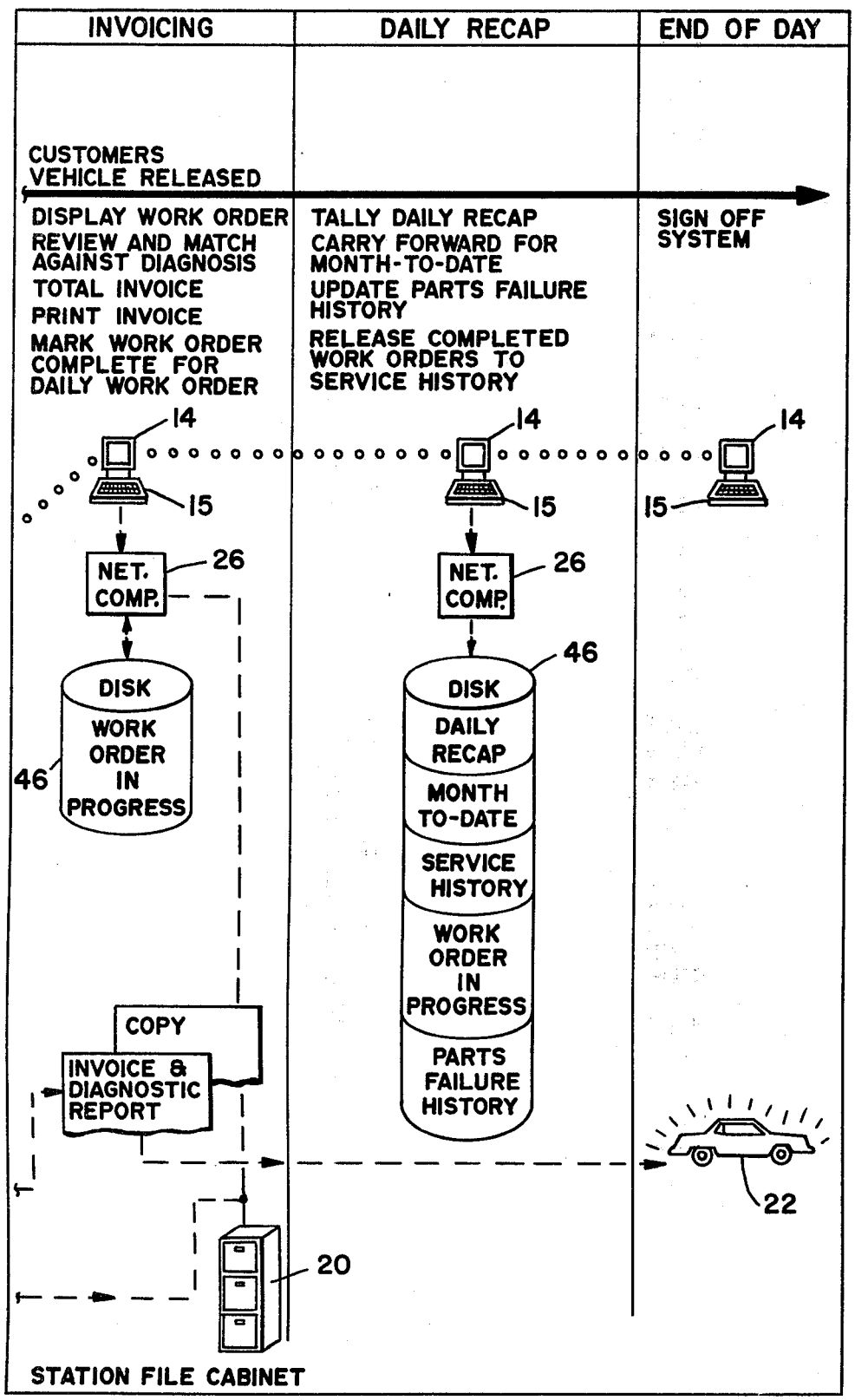
FIG_2C

AUTOMOTIVE DIAGNOSTIC SYSTEM

BACKGROUND OF THE INVENTION

1. Field of the Invention

This invention relates to a system for facilitating the diagnosis and servicing of an automotive vehicle. More particularly, the invention relates to a system that makes equipment or vehicle identification, specifications, service history and present condition readily available to those involved in diagnosing and servicing the equipment and provides a means for advising the equipment owner and the servicing agency with information on the present status of the diagnosis and service activities being performed.

2. Prior Art

The servicing of modern automotive vehicles has become extremely complicated and, to some extent, virtually impossible for some persons because of the complexity of the vehicle, the inadequacy of available specifications on the vehicle and the changes in regulatory requirements applicable to the vehicle. Further, the capability of some diagnostic equipment used in diagnosing and servicing vehicles has not kept pace with changes in the vehicles. Added to these complications is a growing scarcity of personnel trained in servicing such complicated equipment. For example, whereas it had been possible to service many vehicles with internal combustion engines by checking the condition of ignition parts, adjustments of carburetors, or condition of electrical systems and replacing some or all parts, the newer vehicles have engines that do not have the older conventional ignition parts, the fuel supply is not easily adjusted, and the electrical system is sometimes separately controlled by its own built-in computer. Further, some governmental regulatory agencies prohibit some adjustments or have established operating conditions for vehicle engines that require adjustments to an engine's operation that can only be accomplished with special test equipment.

In addition to the complexity of individual parts of a vehicle's drive system, the specifications for some vehicles are further complicated by the many options that are available to the vehicle owner in body style, engine size and type, transmission, and accessory equipment. Some vehicles have different specifications depending upon the factory where the vehicle was assembled or the time in the model year when the vehicle was completed. In some cases manufacturers have changed specifications on particular vehicle engines because of design improvements, original errors or changes in regulations.

Communication of these original specifications, the changes, and other pertinent information relating to groups of engines or specific vehicles has become difficult. It is both difficult to get the information to the vehicle owner and to get the information to the vehicle services agency. Sometimes it is even more difficult to get the person to whom the information is sent, to read and apply the information to the diagnostic and servicing function.

It has been known to provide manuals for service information and, more recently, to provide the service information in microfilm form for review on a view screen. Such microfilm systems require updating by physical replacement of outdated information and therefore have the same problem of communication dependent, to some extent, upon the interest of the receiver of the information.

Most manufacturers supply some essential vehicle specifications in readable form fixed to the vehicle. Such specifications provide identification for the vehicle and other pertinent information that will enable a person servicing the vehicle to identify vehicle and engine specifications. If changes are made in the vehicle, the identification fixed to the vehicle may no longer apply. Further, if the manufacturer or a regulatory agency makes changes that apply to a particular vehicle, those changes will not be known from a reference to the specifications fixed to the vehicle.

Engine analyzers are also known, some are general purpose for use with many vehicles and some are specific to a particular manufacturer's vehicle, and some manufacturers have built microprocessors into the vehicle so as to provide part or all of the engine analysis function. Some engine analyzers merely measure existing conditions in a vehicle and are unable to compare the measured conditions to a standard on a particular specification. Other analyzers provide complete diagnostic capabilities including advising the operator on what corrections should be made.

The summary of the foregoing with regard to the state of the prior art in the modern complicated and regulated vehicle engine diagnosis and service business, is that there is a growing need for a system that will permit an operator or vehicle owner to know the operating specifications for a vehicle, the present condition of the vehicle, the recommended services that could be performed on the vehicle to improve its operation, and the service that has previously been performed on the vehicle.

The system of the present invention is intended to satisfy that need and to provide the vehicle owner and service operator with a means for communicating with records on the owner's vehicle to determine the specifications for the vehicle, what has previously been done to the vehicle, and what is recommended to be done to the vehicle.

The system further provides the owner with a visible and/or printed record of what services are recommended and a record showing that the services are in progress or have been completed. The system provides the service operator with a record of individual vehicle services being recommended and performed, all services of a particular class or type being performed on vehicles in that service location, and recap capabilities on daily or other time intervals to assist in record keeping, scheduling and inventory control.

The objects and features of the present invention will be readily apparent to those skilled in the art from the appended drawings and specification illustrated preferred embodiments.

BRIEF DESCRIPTION OF THE DRAWINGS

FIG. 1 is a block diagram illustrating the relationship of the several elements of the system of the present invention.

FIGS. 2A, 2B and 2C are a flow chart diagram of the system of the present invention.

This invention relates to the work flow involved in diagnosing and servicing a vehicle from the time a customer arrives for an estimate of charges until the invoice has been completed for that vehicle. FIG. 1 illustrates, in block diagram form, the relationship of an individual service station to the vehicle and the data available regarding that vehicle. FIGS. 2A, 2B and 2C graphically depict the work flow.

In accordance with the present invention an individual service station has available a group of separate equipment pieces that function together to assist the station operator in providing service to his customer. As here shown, the service station 10 includes equipment in the form of a printer 12, a video display device 14 with keyboard 15, an analyzer 16, and a viewer 18 which most likely will be adapted to view microfilm records now supplied in a form known as microfiche. The station 10 will have its own records and files 20 preferably in the form of microfiche files which may include the microfiche records as well as other information generally concerning vehicle servicing or specific to certain service or certain vehicles. As shown in this illustration, the station equipment, and particularly the motor analyzer, is attached, in at least a functional sense, to a vehicle 22. A mechanic 23 completes the minimum essential elements within the service station.

As previously stated, it is now recognized that the complexity of individual vehicles and their performance specifications have made it very difficult for individual service station operators to have access to the data they need to diagnose and service an individual vehicle. To alleviate that problem and to provide the station operator or mechanic with the most accurate and up-to-date vehicle specifications on an individual vehicle, the system shown in FIG. 1 illustrates the station 10 connected, by a communication link 24 to a network computer 26 which functions to address, process, route, prioritize, and other data processing functions between the station 10 and sources of supply information.

FIG. 1 further illustrates several sources of information which may be accessed by the service station. Those sources include, as here illustrated, vehicle data and information 28, service station data 30, and a vehicle specialist resource 34. By way of explanation and without limitation blocks 28, 30 and 34 shown in FIG. 1 are intended to contain the following:

Vehicle data and information (28) contains the detail specifications on each vehicle model made available from the manufacturer including electrical, mechanical and operational specifications on all available combinations of body, engine, drive train and accessories. It is expected that this single source of specifications will be as up-to-date as possible and it will be constantly monitored by vehicle specialists shown as block 34 to maintain accuracy, to effect changes as supplied by the manufacturer and to supply footnote or reference data as may be helpful to the station operator in diagnosing or servicing specific vehicles.

Service Station data (30) contains information which is available to individual service stations concerning shared data on either an individual vehicle or a group of vehicles with regard to, for example, past service on a vehicle or recommendations for specific vehicles as well as information on local or regional parts or service availability. The individual station data may also include an individual station's accounting or service records which are machine-stored and retrievable through the network computer link.

The vehicle specialist (34) is a source of information and operational responsibility for management of the vehicle data and information. The specialist can be expected to be aware of details on a narrow class of vehicles, any changes in specifications or regenerations with regard to that narrow class and any trends that might develop indicating needs for particular or peculiar service for those vehicles.

In each of the communication links 24, 27 and 29 there is shown a security block marked S which is intended to illustrate the protection of the particular data from tampering or access from unauthorized persons or sources. It should be understood that specifications must be dependable and accurate to serve the function here illustrated. Further, some shared data and customer data must be protected from unauthorized access.

One additional communication link is illustrated by dotted line 36 connecting the service station 10 and the vehicle specialist 34. This line is intended to illustrate the accessibility of the specialist to the local station operator or mechanic by conventional communication link such as telephone for consultation with regard to a specific vehicle. While such contact is expected to be minimal, it is helpful to an individual station operator or mechanic or vehicle owner to make such a contact route available.

The information communicated from the various sources 28, 30 and 34 through the network computer 26 to the service station 10 can be supplied to each of the equipment devices 12, 14 and 16 to permit "hard copies" to be made, to permit visual displays, and to permit the analyzer to be supplied with "down loaded" vehicle specifications. Dotted line communication link 37 between each of the devices is intended to illustrate the potential interaction between each of these pieces of equipment as will be further explained hereinafter.

FIG. 1 further illustrates by extension of communication link 27 that the vehicle data and information is available to other network computers and by the dotted connections to communication link 24 that the network computers 26 illustrated may also service a number of other service stations within the same regional area.

The system functions are referred to as options to the user. These options, or functions, appear to the user on the cathode ray tube (CRT) 14 adjacent to the analyzer 16. These options are:
Service invoice generation
Service invoice update
Service invoice history
Vehicle identification and specifications
Daily bulletin
Daily recap
Vehicle remarks display
Operator information update.

As with most data processing systems, there is a need for providing an identification that functions as an address for each separate transaction. In the present invention that identification is the service invoice number and is the key to entering a new vehicle into the system. When a customer's vehicle arrives at the station for either a diagnosis and/or a tune-up, basic information is entered into the system and on an inspection form, containing a preprinted invoice number.

The operator uses the keyboard 15 for display on CRT 14 to enter the customer information into the system. This is accomplished by requesting a Service Invoice Generation option which displays on the CRT the form of the service order. A preassigned invoice number on the form is entered into the system to become the work order number. Those blanks on the work order that will require an entry by the operator are identified by prompting marks on the CRT.

The information for each new service invoice will be:
Date

Customer Name
Address (street, city, state, and zip code)
Business and/or home phone numbers
Estimate service order numbers
Estimate amount
Method of payment
Charge authorization number
Mileage
License number and state
Make, year, and model
Vehicle identification number (VIN)—from vehicle.

Other optional information may be added to the service order at this time, such as:
Warranty number
Time wanted (a.m. or p.m.)
Deliver?
Job taken and estimated by
Customer remarks
Last tune-up (mileage an date)
Road tests (with or without the customer)
Motor vehicle inspection certification required
Fuel type (regular, unleaded, premium, diesel)

To assist dealers in servicing their regular customers, new work orders may be generated from existing invoice history file records for the same vehicle. By entering the VIN, selected customer and vehicle information may be supplied to the CRT for the dealer to modify. This will allow the dealer to use the existing vehicle specification record, after entering current work order information, to:
Print the tune-up parts list
Print the addresses to selected subsystem service manuals
Download engine specifications to the analyzer Once the work order has been entered into the system, it becomes a "work order in progress," thus accessible by several keys:
Work order number
Customer name
Make/year/model
Vehicle identification number
License number Assuming that the vehicle has not been previously serviced at a service station that has collected vehicle identification information, the next step of data capture for diagnosis and servicing is the identification of the engine for specification selection. Because of the wide range of engine, ignition, and carburetion combinations for a particular make, year, and model vehicle, automobile manufacturers affix decals to engines denoting the specification particulars for each engine, such as:
Federal or State, i.e. California, etc.
Carburetor
Design level
Air conditioning equipped
Calibration number
Revision levels Further distinguishing specifications will also be located on various underhood decals.

By requesting the Vehicle Identification option on the CRT, the dealer will key in the work order number of the vehicle to be identified and the system will respond with a printed data capture form, constructed by the Vehicle Specialist. This form will direct the dealer on engine identification data capture. Since the work order in the "work order in progress" file already contains the make/year/model, and VIN number, the dealer will not be required to reenter this information. However, should the dealer wish to perform an analysis on a vehicle for which a work order has not been created, the dealer may enter the vehicle's make/year/model and VIN and proceed as above.

The Specification Compare option of the Vehicle Identification menu will confirm the work number, make/year/model, and VIN of the last vehicle for which a capture form was generated. This will eliminate the need for reentering the confirming information; however, it will give the dealer the flexibility of preparing capture forms for multiple vehicles awaiting tune-ups. Should a capture form have been subsequently generated for other than the current vehicle, the dealer need only reenter the work order number.

Considering only those vehicles existing at the time of filing of this application, over 800 combinations of make, year, model, and vehicle identification number have been identified, with a structured breakdown of approximately 4,000 individual vehicle specification records. By entering all the information requested on the capture form, the selection of a vehicle specification record from the displayed list of matching criteria records at the CRT will be reduced significantly.

When a match has been found between the information captured on the capture form and the information displayed for a vehicle specification record on the CRT, the dealer will select the record number displayed adjacent to the vehicle specification record. This record number will be stored in the respective work order record. The dealer will then select one or more of the following options:
Print the tune-up parts list
Select the vehicle subsystem (e.g., ignition)
  Display an index of the manufacturer's service manual on the CRT
  Print the manufacturer's service manual indexes on the printer
Download the engine specifications to the analyzer
The last option is valid only if the analyzer is not currently in use.

Diagnosis and Repair

The downloading of engine specifications to the analyzer has transmitted diagnostic information to the analyzer and the analyzer is ready to be connected to the vehicle. The analyzer will be provided with the necessary linking connections that will permit the analyzer to have all of the necessary condition signals that will permit the analyzer to diagnose the condition of the engine. Most analyzers require connections to the electrical systems, the timing systems, the fuel and carburetion systems, the exhaust system, and other systems which will be known to those skilled in this art. When all the connectors have been attached to the vehicle, the dealer will then begin the initial diagnosis.

A representative series of tests on an engine are as follows:

STATIC VOLTAGE

Measures

Battery surface voltage
Ignition primary voltages (coil + and −) and amperage

CRANKING

Measures

Battery voltage drop
Ignition primary voltages

Cranking RPM
Cranking amperage by cylinder
Oil temperature

ALTERNATOR

Measures

Alternator voltage and amperage—loaded and unloaded
Engine RPM
Field terminal voltage
Ripple
Oil temperature

IGNITION PRIMARY

Measures

Engine RPM
Dwell—percent and degrees
Ignition primary voltages
Cam error
Distributor variation
Oil temperature

IGNITION TIMING

Measures

Engine RPM
Basic timing
Engine vacuum
Advance at specified RPM
Advance curves
   Vacuum
   Centrifugal
Oil temperature

IGNITION SECONDARY

Measures

Engine RPM
Spark plug firing voltage and duration by cylinder at specified RPM and snap acceleration
Maximum firing voltage by cylinder
Coil output
Oil temperature

EXHAUST GAS

Measures

Engine RPM and variation
Oil temperature
Exhaust temperature—minimum and maximum
Fuel pump pressure, volume and vacuum
HC
CO
$O_2$

CYLINDER POWER BALANCE

Measures

By cylinder
   Engine RPM drop pl HC
   CO
   $O_2$
Oil temperature
Exhaust temperature

CYLINDER SUMMARY

Display by Cylinder

Cranking amps
HC change
Power balance

The results of each test will be transmitted back to the network computer 26 to be stored for that work order in progress.

At the dealer's option, the printer 12 may be activated so that results from each test will not only be transmitted back to the network computer, but also displayed on the printer. This function is also useful should a diagnosis be performed for a vehicle without a valid accompanying work order since the test results will not be transmitted to the network computer, but will be optionally available on the printer for future reference.

At the end of the initial diagnosis, a vehicle for which only a diagnosis is being performed would be disconnected from the analyzer and the customer advised of that service only. A vehicle 22 for which a tune-up is to be performed would remain connected to the analyzer 16 and the operator would then place the analyzer into manual mode. These tests may be performed in any sequence and, as each test is completed and a new test is requested, the results of each test will be available on the printer. The reason for retaining the printed display of each test is so that if a change is made in a subsequent test, the dealer can refer back to the prior test to see what effect that modification or adjustment had made.

As part of the vehicle identification procedures, a list of parts required for tune-up is printed by the printer 12. With this parts list, the mechanic can then remove from stock and assign to the vehicle being serviced those parts necessary for a tune-up. During the repair mode of a vehicle being serviced, the operator can access the Service Invoice Update function of the system using the CRT 14 adjacent to the analyzer 16. By entering the work order number, the dealer can update the parts record with those parts that have been added to the vehicle being serviced. The dealer need only enter the part number and the quantity for each item and the system will display a confirmation of the quantity and the part number, followed by a description of the part, its unit retail price, and the total price for that part. If the part replacement was due to failure, or if the part was detected to have failed during use, the dealer will note this accordingly in the part failure column. This information will be transmitted to the vehicle specialist 34 through the network computer 26 for evaluation of parts failure. By requesting the labor update option, the dealer can enter the number of hours assigned to that vehicle and the labor rate from the dealer's labor file will be applied to that work order for later invoicing. By requesting the sublet work update option, the dealer can enter the purchase order number, the subcontractor's name, and the sales amount.

Upon completion of the repair mode or tune-up mode, the analyzer is placed back in the automatic mode for the final diagnosis. This is to ensure that the vehicle is now in compliance with the specifications. Again, the results of each test are transmitted back to the network computer for retention within the Work Order In Progress file. When it has been verified that the services to the vehicle have been completed, the motor analyzer is disconnected from the vehicle and invoicing from that vehicle is ready to be completed.

Invoicing

An invoice can be generated for any vehicle in the Work Order In Progress file at any stage during the vehicle's servicing should the dealer select to close out that work order. Since all information regarding that vehicle has been entered from the time that work order was initiated, the dealer has a complete record of all parts, labor, and sublet work associated with that vehicle. As an option, the dealer can run a subtotal on all parts and labor to date to verify that the original estimate has not been exceeded. Both the customer and the dealer may wish to be aware that an estimate has or may be exceeded so as to avoid conflict with consumer protection legislation which has been enacted in several states of the United States. The dealer may contact the customer for additional repairs authorization and then note either a confirmation or refusal of the additional repairs.

Should the work order be complete, the dealer would proceed with invoicing. All information pertaining to that invoice would be displayed upon the CRT. The dealer has the option to use the prices in the dealer price file and the dealer's labor file for total invoicing or, should the dealer elect, to alter any price. When all the charges for labor, parts, and sublet work repairs have been tallied and accepted by the dealer, the system will calculate the applicable state and local tax and generate the total amount for that invoice. When an invoice has been accepted as complete by the dealer, it will be marked as such and retained in the Work Order In Progress file for daily recap purposes.

When an invoice has been completed, it will be printed on the printer. If an analysis was performed on the vehicle, the diagnostic report may be printed, starting on a new page, following the invoice. The distribution of the printed output will be as follows:

The original of the system generated service invoice and diagnostic report will be attached to the customer's invoice copy of the Tune-Up and Emission Inspection form for the customer The copy of the system generated service invoice and diagnostic report will be attached to the station file copy of the Tune-Up and Emission Inspection form for the dealer.

Daily Recap

The daily recap can be performed at any time, although it is assumed that the daily recap will be performed at the end of a working day or at the beginning of the next working day. This will be a batch procedure initiated from the service station. The daily recap goes through the Work Order In Progress file and tallies items such as:

Tires
Batteries
Accessories
Parts
Lubrication
Labor
Other products
Sales tax
Total sales
Work orders completed
Work orders outstanding.

For those jobs that are incomplete, the original date of the work order will be printed. This recap may be printed on the printer in one of the following modes: a daily recap and a month-to-date recap. When a daily recap has been displayed and printed, the dealer may be asked if he wants to close his daily recap. If the dealer elects to close the daily recap, that information may be carried forward in the month-to-date recap. On a month-to-date recap, the dealer may be asked if he wishes to close his monthly recap. If a monthly recap has not, as yet, been printed, the dealer may be asked if he wishes to print the monthly recap prior to closing the monthly recap. When a recap is printed, the closing on a monthly recap record will be cleared to start a new month.

If the dealer elects to close the daily recap, all completed work orders will be transferred to the Service Invoice History file. Extracted information from the completed work orders will be transferred to the Master History file. Parts failure data will be recorded for evaluation by the Vehicle Specialist 34.

Service Invoice History File

The dealer's Service Invoice History file will contain a copy of all completed service invoices.

Print Formats

The printer 14 is used for the generation of:
Invoices
Vehicle data capture forms
Vehicle diagnostic reports
Recap reports
Tune-up parts lists
Vehicle subsystem manual microfiche title labels and index address references
Bulletins

Video Formats

When the dealer wishes to perform diagnostic and service function, the system will prompt the dealer for the correct entry. At any time during system operation, the dealer may return to the Master Menu, or "log off" the system.

In addition to the password required to "log on" the security S in the communication links 24, 27, 29 and 35 in the system requires a dealer-supplied password for:
Recap
Dealer file update
The purpose of the two-level password access is to prevent unauthorized personnel from using the system. The system security access passwords are preferably centrally controlled, service station financial data access security in station data 30 may be controlled by the individual dealer.

FIGS. 2A, 2B and 2C illustrate the system of the present invention in relative time sequence from left to right through FIG. 2A, FIG. 2B, and FIG. 2C.

As illustrated in the upper left corner of FIG. 2A, the customer 40 and vehicle 22 arrive at the station with a known or unknown operational problem. As previously described, the customer supplies some information pertaining to the vehicle 22 to the station operator or dealer to create an initial service estimate with a copy 41 for the station records, a copy 42 for the customer, and the original 43 for working within the system. Dotted lines illustrate the expected use of the estimate copies.

From the information on original copy 43 an entry is made into the system of this invention by selecting the option service invoice generation for creating a work order against which all work on the specific vehicle 22 will be recorded. This selection is implemented by displaying on the CRT 14 the available options and by the dealer or operator selecting the function of service invoice generation through keying an appropriate key on keyboard 15.

The entry of a service invoice generation command with appropriate customer identification will permit the network computer (NET. COMP.) to search for previous service orders for the same customer in the service station data 30 (FIG. 1) to provide details to complete the service invoice generation and to provide background information, if available, on the customer and vehicle being serviced. As shown in FIG. 2A, the network computer enters information into and derives information from a storage disk 46 in service station data 30 containing work order in progress information. Available information is displayed on the CRT 14 screen with blanks for unavailable information. If customer or vehicle information is not available on storage in disk 46, the dealer or operator enters such information through keyboard 15 to complete the service invoice.

At this time the vehicle identification number (VIN) is determined from inspection of the vehicle. All vehicle manufacturers are required to install, in an accessible location, a vehicle identification number plate, a vehicle certification label, and a series of various underhood tags, plates, decals and labels. The information contained on these supplies an observer with the:
(1) consecutive unit number for the vehicle
(2) body serial code
(3) model year code
(4) assembly plant code
(5) body type code
(6) engine code
(7) color code
(8) trim code
(9) transmission code
(10) rear axle code
(11) district—special equipment
(12) vehicle type.

With that code information the dealer may refer to the manufacturer's manuals to identify details for a particular car. The dealer must also identify the exhaust emission specification decal on a vehicle being serviced.

Having produced the vehicle identification number and entered it into the service invoice form through keyboard 15, the dealer has identified complete details on the customer and vehicle and has caused that information to be entered into the work order in progress disk 46. That information may then be printed at printer 12 to produce a "hard copy" reference to be attached to the vehicle. The identification of a vehicle by its vehicle identification number (VIN) has also permitted the system to access the specifications for that particular vehicle through the network computer 26 to the storage disk 2 where complete vehicle specifications for each vehicle have previously been stored.

FIG. 2B depicts the system functions for diagnosis and repair for a vehicle. With the vehicle 22 connected to an analyzer 16 and both connected through the network computer 26 to the vehicle data and information 28 (FIG. 1) including vehicle specifications storage disk 2, the engine specifications for a particular vehicle may be "down loaded", i.e. transferred, to the motor analyzer 16 for retrievable storage. The specification stored in the disk 2 may also contain a listing of parts associated with the tune-up of that vehicle and an index or menu of other available visual data that may be accessed for that vehicle. The parts list may be down loaded through the network computer 26 to the printer 12 for access by an operator and the index or menu of other data may be displayed on the CRT 14. With that information an operator will have operation specifications for the vehicle, a parts list, and a reference chart of other available vehicle information.

The other available vehicle information may include such necessary items as a wiring diagram or mechanical diagram of engine elements that may be viewed through an appropriate viewer. In FIG. 2B the menu is displayable on CRT 14 to inform the operator where the desired diagram can be found in a suitable manual or station microfiche file 20 (FIG. 1).

At this point in the process of the present invention the operator or dealer has the vehicle 22 attached to the motor analyzer 16, the motor analyzer has supplied to it the specifications for tune-up of the particular vehicle 22, and the operator has a means for identifying and viewing additional information concerning the vehicle 22. It is contemplated that the analyzer is capable of measuring and providing an output display or signal that will show the present operating condition of the vehicle and/or the difference between the present condition and the manufacturers specifications for operation of the vehicle. Condition and operation are contemplated to include motor operation as well as electrical and mechanical conditions on the vehicle that are capable of being measured and compared to established specifications. The output from the analyzer 16 should be most, if not all, of the conditions stated under the heading of "DIAGNOSIS AND REPAIR". The comparative data may be selected items which will permit the dealer or operator to establish a preliminary diagnosis of any changes in vehicle operating conditions that would be expected to improve vehicle operation or bring the vehicle into conformance with the specifications for that vehicle.

Engine analyzers of the type contemplated herein are available from manufacturers such as Bear Automotive Service Equipment, Inc., Sun Electric Co., Allen Equipment Co., and United Technologies.

The comparative information from the analyzer 16 will be supplied to a printer 12 where the operator may analyze the information from the analyzer and recommend remedial action to the vehicle. Some of the analyzers listed above provide diagnostic output information that will supplement or assist an operator in providing a diagnosis. If parts are required or adjustments are to be made to the vehicle, those actions may be taken and the operation of the vehicle measured again. The initial diagnosis of the vehicle condition will have been supplied to the work in progress disk 46 and stored in accordance with the work order that identifies vehicle being analyzed. When the repairs have been completed for that vehicle, the then operating conditions are supplied to the work in progress disk 46 in accordance with work order so that a comparison may be supplied for any particular vehicle.

It is also contemplated that the status of any work order in progress can be viewed by the operator by accessing that information on the CRT 14. The work order is continuously updated with any activity with respect to that work order including entering parts, labor and sublet work as well as any comments that the operator may want to enter with regard to separate reports such as parts failure or other vehicle conditions not covered by the work order in progress.

The system of the present invention allows the analyzer 16 to be programmed from the vehicle specification disk 2 through the network computer 26. In that mode it is possible to control the sequence of tests performed by the analyzer 16 on the vehicle 22 and to control the display of measured data from the vehicle with respect to specification data supplied to the analyzer 16 from the vehicle specification data. This feature of the present invention permits the diagnosis and analysis of an automotive vehicle in many different operating conditions and permits the vehicle specialist 34 shown in FIG. 1 to be able to optimize the operation of the motor analyzer 16. The analyzer 16 must either be capable of accepting these "downloaded" instructions or the mechanic may view the recommendations on a CRT 14 and manually control the analyzer accordingly.

Also shown in FIG. 2B is a Vehicle Remarks File disk 3 containing pertinent information for the operator with regard to specific or classes of automotive vehicles. The information from disk 3 constitutes a part of the vehicle data and information 28 shown in FIG. 1 and is accessible through the network computer 26 for viewing on the CRT 14.

The diagnosis or analysis produced by the motor analyzer 16 by measuring data from the motor vehicle with respect to specifications supplied from the vehicle specification disk 3 is made available to the printer 12 where a "hard copy" of measured and specification data may be produced for further analysis by a mechanic. That data is also supplied to the work order in progress disk 46 through the network computer 26 where it is stored with respect to the particular vehicle in accordance with its individual work order number.

The system of the present invention has so far supplied to a mechanic or service station operator the present condition of the vehicle, the specifications for proper operation of the vehicle, the operating routines for an analyzer if needed, and an indication of the differences between the present vehicle condition and specifications.

The invention may also indicate the preferred change in vehicle condition to bring the vehicle into agreement with the specifications. Whether that change is automatically supplied by the analyzer 16 or whether the differences between present condition and specification is analyzed by a mechanic makes no difference in the present invention, it is only important that the vehicle be serviced or "tuned-up" to change its operating condition.

When a change in vehicle operation has been accomplished the vehicle is again attached to the analyzer and its operating condition determined and further compared to specifications. It is, of course, expected that the vehicle's operation will come into conformance with the specifications supplied to the analyzer. The final operating conditions are supplied to the work in progress disk 46 from the analyzer through the network computer 26. That final diagnosis is viewable at the CRT 14 through the network computer 26 and a "hard copy" is producable at the printer 12 directly from the analyzer 16. The printer output can include all parts, labor and sublet work charged to the service order identifying the vehicle and may also include additional remarks concerning part failures or service remarks concerning the vehicle.

FIG. 2C illustrates the final record keeping and summaries that are producable with the method and apparatus of the present invention. In producing an invoice for the customer after the servicing has been completed, the CRT 14 displays the information contained in the work in progress disk 46 through the network computer 26. That disk contained the original service estimate so that the customer and operator can now compare the estimate with the final services. That same information is supplied to the service station files to maintain a record of the work performed and may be converted to microfiche record storage.

The foregoing operations of the system as shown in FIGS. 2A and 2B and the initial part of FIG. 2C have been mostly related to an individual vehicle, customer and service order. The system permits the operator to produce a tally of daily operations and work in progress to assist in maintaining an efficient service operation. The CRT 14 may provide a display of many categories of records maintained in the storage capacity available through the network computer. As illustrated, the operator may access the disk 46 through the network computer 26 to display a daily recap of work in progress, a monthly summary of work performed, a service history for individual vehicles or a class of vehicles, a display of present work in progress, and a recap of parts failure history. The foregoing summaries and up-dates are representative of the type and kind of information available. By separately identifying particular parts and services supplied by the dealer, the record can supply a recap of categories such as tires and batteries, tune-up, wheel and brake services, or any other separate item.

As illustrated in the right-most side of FIG. 2C, an end-of-the day display is available at the CRT 14. This function permits the operator to access information within the disk storage at any CRT 14 that may be attached to the disk through the network computer 26. That location need not be at the actual service location but may be at any CRT 14 having access to the network computer 26. An operator having several service locations may access the information at a single location and thus avail himself of summary information in preparation for parts or mechanic labor requirements.

As herein described, the system permits an accurate record to be kept on each service order in progress and completed. Because the records are accessed through a network computer, it is possible to reproduce a record of previous services performed on a vehicle at another service location. Having the vehicle identification number (VIN) it is possible to retrieve the record of previous services stored in the service station data 30. Access to such information may require entry through a security screen established to provide security for both the vehicle owner and the service operator.

It is contemplated that the system of the present invention will benefit the vehicle owner, the service operator and the general public in many ways. The vehicle owner is benefited by having a clear estimate of services to be performed based on the actual up-to-date manufacturers specifications applicable to that particular vehicle. The service operator is benefited by having an accessible, dependable set of specifications to which he can perform services. The system also provides access to a specialist for the unusual or complex service request. The operator also gets a system that can supply his record keeping demands. The general public is benefited by having up-to-date vehicle specifications available to the service operator so that the services supplied can be expected to meet the specifications that have been established for satisfying environmental protection regulations.

While certain preferred embodiments of the invention have been specifically disclosed, it should be understood that the invention is not limited thereto as many variations will be readily apparent to those skilled in the art and the invention is to be given its broadest possible interpretation within the terms of the following claims.

What is claimed is:

1. An apparatus for facilitating the diagnosing and servicing of an automotive vehicle from service request to completed servicing and invoicing comprising:
   (a) diagnostic test equipment including means for attaching said equipment to said vehicle and means for measuring operating conditions of said vehicle;
   (b) a display means;
   (c) means for entering into said display means vehicle identification data unique to said vehicle;
   (d) data base storage means, said data base including specifications for automotive vehicles including said vehicle to be serviced;
   (e) means for selecting from said data base the specification data unique to said vehicle in accordance with said vehicle identification data and means for transferring said selected specifications to said diagnostic test equipment attached to said vehicle,
   (f) means for transferring measured data representing the current operating condition of said vehicle from said diagnostic test equipment to said display means,
   (g) means for producing a printed record and a stored record of said transferred measured data and said specification data,
   (h) means for selecting service manual index data unique to said vehicle from said data base in accordance with said vehicle identification data and means for transferring said indices to said display means,
   (i) means for selecting parts data unique to said vehicle from said data base in accordance with said vehicle identification data and means for transferring said parts data to said display means,
   (j) means for selecting diagnostic and service remarks unique to said vehicle from said data base in accordance with said vehicle identification data and means for transferring said diagnostic and service remarks data, to said display means, and
   (k) means for producing a stored record and a printed record of said data supplied to said display means.

2. The apparatus of claim 1 wherein said data base storage means includes means for controlling said diagnostic test equipment in accordance with data unique to said vehicle.

3. The apparatus of claim 2 wherein said means for controlling said diagnostic test equipment is selected in accordance with said vehicle identification data unique to said vehicle.

4. The apparatus of claim 3 wherein said means for controlling said diagnostic equipment transfers control functions including control of said means for measuring operating conditions of said vehicle and said means for transferring measured data to said display means, and wherein said means for controlling transfers said control functions from said data base storage means to said diagnostic test equipment.

5. The apparatus of claim 2 wherein said means for controlling said diagnostic test equipment also includes service manual index data; means for selecting parts data, diagnostic and service remarks for vehicles; and control functions for control of said diagnostic equipment comprising:
   (i) diagnostic tests for vehicles,
   (ii) display of diagnostic test results, and
   (iii) control means transferable to said diagnostic test equipment to cause said test equipment to perform said diagnostic tests and display said diagnostic test results.

6. The apparatus of claim 5 including means for accessing said data base storage means to change the data base stored in said storage means including at least:
   (i) said specifications for automotive vehicles and
   (ii) said means for controlling said diagnostic test equipment, and
   (iii) said index data, parts data, diagnostic and service remarks, and control functions.

7. The apparatus of claim 2 wherein said means for controlling said diagnostic test equipment includes a microprocessor, and said data base storage means includes software routines for said microprocessor in said diagnostic test equipment, and means for transferring said software routines to said microprocessor in said diagnostic test equipment.

8. The apparatus of claim 1 wherein said means for transferring measured data from said diagnostic test equipment to said display means includes means for transferring digitized waveform said measured data.

9. The apparatus of claim 1 including means for comparing said transferred measured data with said specification data unique to said vehicle transferred to said display means, and means for identifying differences between said measured data and said specification data.

10. The apparatus of claim 9, including means for producing a printed record and a stored record of services performed and to be performed on said vehicle based on said differences between said measured data and said specification data.

11. The apparatus of claim 10 including means for storing and retrieving said record of said services performed and to be performed for access according to said vehicle identification data.

12. The apparatus of claim 10 including means for retrieving said stored record of services performed and to be performed according to degree of completion.

13. The apparatus of claim 10 including means for storing and retrieving said record of services performed and to be performed according to types of services performed.

14. The apparatus of claim 1 including means for entering to said display means the identification and quantity of parts, labor hours by labor category, and description and amount of sublet service work performed in servicing said automotive vehicle.

15. The apparatus of claim 14 including means for storing pricing data with respect to parts, services and sublet service work for services performed in servicing said vehicle and means for supplying said pricing data to said display means.

16. The apparatus of claim 15 wherein said means for producing a printed record includes means for producing a final invoice based on said data supplied to said display means with respect to servicing said vehicle.

17. The apparatus of claim 1 including a network computer for communicating between at least said data base storage means and said diagnostic test equipment, said display means, and said means for producing said printed record and stored record.

18. A method for facilitating the diagnosing and servicing of an automotive vehicle having a unique vehicle identification with apparatus including diagnostic test equipment, storing means for storing and retrieving data pertaining to said vehicle and measured with respect to said vehicle, a vehicle data base including vehicle specifications and diagnostic data pertaining to operation of said diagnostic test equipment, a communicating network computer for interconnecting said diagnostic test equipment, said storing means and said data base, display means for displaying data from said diagnostic test equipment, said storing means and said vehicle data base, and printing means for producing a printed record of said retrieved data, said method comprising the steps of:

(a) connecting said vehicle having said unique identification to said diagnostic test equipment and identifying said vehicle in said test equipment by said unique identification, said diagnostic test equipment having the capability of sensing a plurality of conditions representing the operating condition of said vehicle, (b) supplying to said diagnostic test equipment from said data base the specifications that apply to operation of said vehicle in accordance with said vehicle identification, (c) supplying to said diagnostic test equipment from said data base any unique sequence of diagnostic tests for operating said diagnostic test equipment in sensing said conditions representing the operation of said vehicle, (d) measuring data with said diagnostic test equipment in accordance with said unique sequence of diagnostic tests to produce a first set of data representing the current operating condition of said vehicle, (e) displaying and storing said first set of data measured in step (d) in a manner permitting comparison to said specifications that apply to operation of said vehicle, (f) determining from said display and comparison the diagnosis and services to be performed on said vehicle to accomplish servicing of said vehicle, (g) storing said diagnosis and services to be performed with respect to said vehicle, (h) deriving from said data base information pertaining to said vehicle and said diagnosis and services to be performed with respect to said vehicle, (i) based on said diagnosis and services to be performed, servicing said vehicle to change said operating conditions and measuring said data with said diagnostic test equipment to produce a second set of data representing serviced operating condition of said vehicle, (j) displaying and storing said second set of data measured in step (i), (k) supplying to said storing means data pertaining to parts and services involved in servicing said vehicle including pricing data applicable thereto, (l) retrieving at least part of said data stored in said storing means and producing a printed record of said retrieved data, (m) and maintaining a record of said stored data with respect to said unique vehicle identification.

19. The method of claim 18 wherein said supplying of unique sequence of diagnostic tests from said data base in step (c) is a set of software routines unique to said vehicle being serviced which programs said diagnostic test equipment to perform said routines, said routines being then retrievably installed in said diagnostic test equipment to control operation of said diagnostic test equipment, and performing said sequence of diagnostic tests in accord with said routines.

20. The method of claim 19 wherein said software routines are supplied to a microprocessor in said diagnostic test equipment, then programming said microprocessor in accord with said software routines whereby said software routines control operation of said microprocessor in performing diagnostic tests on said vehicle.

21. In the method of claim 18 said communicating network computer being functionally connected as the interface between one vehicle data base, one storing means, and a plurality of diagnostic test equipment, display means, and printing means, the step of programming said network computer for routing said communicating between said vehicle data base, said storing means and said plurality of diagnostic test equipment, display means and printing means in accordance with said unique vehicle identification.

22. In the method of claim 18 wherein said storing means contains separate storage for each vehicle being serviced, each vehicle previously serviced, and records pertaining to servicing of other vehicles; said vehicle data base contains vehicle data and information pertaining to classes of vehicles and unique vehicles; the step of programming said communicating network computer (a) to access said storing means contents and said vehicle data base in accord with said unique vehicle identification to establish control of said diagnostic test equipment from said data base, (b) to cause display at said means, and (c) to produce printed records at said printing means.

23. The method of claim 18 with the additional step of accessing said one data base for changing vehicle specifications and diagnostic data at said data base whereby a single data base change provides vehicle specification and diagnostic data in accord with said change to a plurality of diagnostic test equipment through said communicating network computer.

24. In the method of claim 18 the step of programming said communicating network computer to access said storing means and said vehicle data base in accord with said unique vehicle identification to retrieve said stored data in accord with said unique vehicle identification, and to maintain a record of services performed on a vehicle in accord with said unique vehicle identification for future retrieval.

25. In the method of claim 24 the step of storing said information in said storing means by type of services performed whereby a stored record for each unique vehicle is maintained current with services performed, and said stored information is accessible through said communicating network computer to permit a display at any of said display means and a printed record at any of said printers of status reports of at least work in progress, work completed, work by type of service, inventory control, on substantially any time period report, for all unique vehicle stored records.

* * * * *